United States Patent [19]

Miyagi et al.

[11] 4,363,074
[45] Dec. 7, 1982

[54] HIGH VOLTAGE GENERATING DEVICE

[75] Inventors: Toshimi Miyagi, Kusatsu; Saburo Kitao, Kyoto, both of Japan

[73] Assignee: Murata Manufacturing Co., Ltd., Japan

[21] Appl. No.: 240,957

[22] Filed: Mar. 5, 1981

[30] Foreign Application Priority Data

Mar. 7, 1980 [JP] Japan .......................... 55/30443[U]
Aug. 9, 1980 [JP] Japan .......................... 55/109635
Aug. 9, 1980 [JP] Japan .......................... 55/109636

[51] Int. Cl.³ ............................................. H05K 5/00
[52] U.S. Cl. .................................... 361/331; 361/424;
336/96
[58] Field of Search ................. 307/150; 361/331, 334,
361/415, 424, 427, 429, 417–419; 363/146;
336/96, 185

[56] References Cited

U.S. PATENT DOCUMENTS 3,905,001 9/1975 Sato et al. ............................. 336/96
4,246,636 1/1981 Kawamura ......................... 363/146
4,307,436 12/1981 Eckart ............................... 361/334

Primary Examiner—G. P. Tolin
Attorney, Agent, or Firm—Ostrolenk, Faber, Gerb & Soffen

[57] ABSTRACT

An improved high voltage generating device such as a fly back transformer or the like which includes a first casing open at one side face thereof and accommodating therein high voltage electrical components, a second casing which is mounted in a cut-out portion formed in a side wall of the first casing and open at its one edge, and an electrically insulating material filled in a space within the first casing. In the above high voltage generating device, undesirable leakage of insulating material between a cut-out portion of a casing and a high voltage variable resistor during its injection into the casing is advantageously prevented without necessity for employing extra parts such as packings, etc., and thus the assembly work is simplified, with consequent reduction in cost.

9 Claims, 15 Drawing Figures

HIGH VOLTAGE GENERATING DEVICE

BACKGROUND OF THE INVENTION

The present invention generally relates to a high voltage generating device and more particularly, to a high voltage generating device such as a fly back transformer or the like for obtaining high voltages to be supplied, for example, to cathode ray tubes, etc. of TV receiving sets, which is provided with a high voltage variable resistor incorporated therein as one unit to obtain high voltages, for example, a focus voltage to be fed to the cathode ray tube, or provided only with a shielding plate for sealing the casing of the high voltage generating device.

In a conventional high voltage generating device, for example, a fly back transformer of the above described type, it has been so arranged that a notch or cut-out portion is formed in a wall of a casing in which high voltage generating components such as a primary winding, a secondary winding, a rectifier, etc. are accommodated, so that a high voltage variable resistor is mounted in said cut-out portion. However, in the known arrangement as described above, since electrically insulating material such as epoxy resin or the like is to be poured or injected into the casing for subsequent hardening thereof, it has been required to employ a sealing member such as a packing and the like, between the cut-out portion in the wall of the casing and the high voltage variable resistor for preventing leakage of the insulating material therethrough during pouring of said insulating material into the casing, thus resulting not only in high cost, but in complication of assembly work of the high voltage generating device itself. Furthermore, even in a case where a high voltage generating device not requiring the high voltage variable resistor is to be constructed with the use of the casing formed with the cut-out portion for mounting a high voltage variable resistor, a shielding plate for closing the cut-out portion is necessary, and in order to tightly seal such cut-out portion, a sealing member such as the packing, etc. must also be employed, thus being still more uneconomical, since in such an arrangement, it is not intended to employ an expensive high voltage variable resistor originally.

SUMMARY OF THE INVENTION

Accordingly, an essential object of the present invention is to provide an improved high voltage generating device such as a fly back transformer or the like in which undesirable leakage of insulating material between a cut-out portion of a casing and a high voltage variable resistor during injection thereof into the casing of the device, is advantageously prevented without necessity for employing extra parts such as packings, etc., thereby to simplify the assembly work, with consequent reduction in cost.

Another important object of the present invention is to provide an improved high voltage generating device of the above described type in which, even when a shielding plate is employed instead of the high voltage variable resistor, the undesirable leakage of insulating material between the cut-out portion and the shielding plate is prevented without necessity of employing extra parts such as packings, etc.

A further object of the present invention is to provide an improved high voltage generating device of the above described type which is simple in construction and highly reliable, and can be manufactured on a large scale at low cost.

In accomplishing these and other objects, according to one preferred embodiment of the present invention, there is provided a high voltage generating device which includes a first casing open at its one side face and accommodating high voltage electrical components in it, a second casing which is mounted in a cut-out portion formed in a side wall of the first casing and open at its one edge, and an electrically insulating material filled in a space within the first casing. The first casing is provided, along its entire peripheral wall adjacent to the cut-out portion, with a fitting groove extending from the one open side face towards the bottom portion of the first casing and tapered or sloped so as to be narrowed at the side of the bottom portion, and the second casing is formed with a wire-like protrusion provided adjacent to its peripheral edges on its one surface in a position corresponding to one side face of the cut-out portion defining the fitting groove of the first casing, while the peripheral edges of the second casing which include the wire-like protrusion are arranged, in the thickness, to be larger to a certain extent, than the widths of the fitting groove at the portions corresponding to respective portions of the fitting groove.

By the arrangement of the present invention as described above, an improved high voltage generating device is advantageously presented through simple construction, with substantial elimination of disadvantages inherent in the conventional high voltage generating devices of this kind.

BRIEF DESCRIPTION OF THE DRAWINGS

These and other objects and features of the present invention will become apparent from the following description taken in conjunction with the preferred embodiment thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Figure 1:
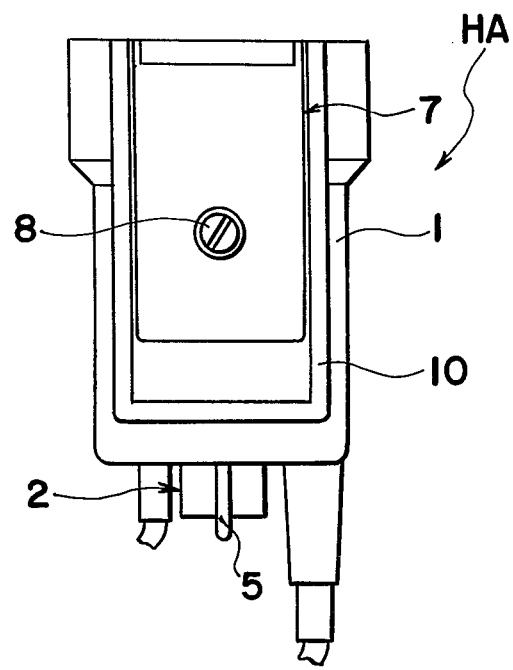
FIG. 1 is a schematic front elevational view of a high voltage generating device or a fly back transformer according to one preferred embodiment of the present invention.
Figure 2:
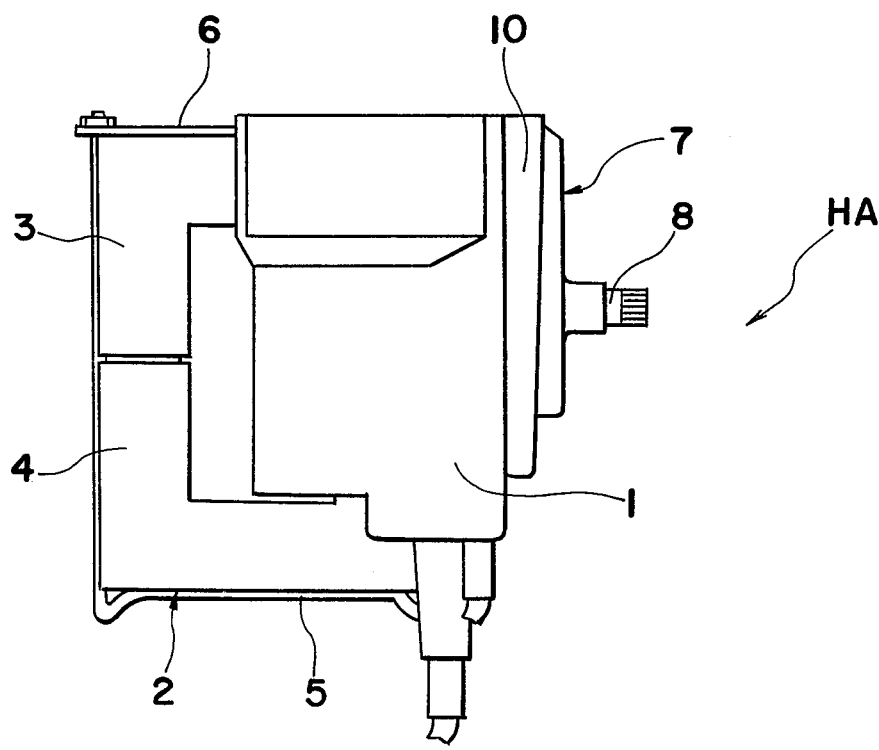
FIG. 2 is a side elevational view of the high voltage generating device of FIG. 1.

Referring now to the drawings, there is shown in FIGS. 1 and 2 a high voltage generating device in the form of a fly back transformer HA according to one preferred embodiment of the present invention. The fly back transformer HA generally includes a main or first casing 1 open at its one side and made of an electrically insulative material having a cut-out portion 9 (FIG. 3) formed at one side wall of said first casing and open at its one edge, a closed circuit type core 2 provided in said casing 1 so as to extend through a bottom wall of said casing 1 and constituted by a pair of generally U-shaped mating cores 3 and 4 to be secured to the casing 1, for example, by corresponding metal fittings 5 and 6, and a high voltage variable resistor 7 fitted into the cut-out portion 9 of the casing 1, with its control knob 8 extending outwardly therefrom, so as to divide output voltage from a secondary winding mentioned later for obtaining high voltages such as a focus voltage for a cathode ray tube or the like.

Although not shown for brevity, in the above arrangement of FIGS. 1 and 2, for example, a high voltage generating component including a primary winding and the secondary winding wound around leg portions of the core 2, is further accommodated in the casing 1, while insulating material, for example, of epoxy resin is filled in space or gap portions within said casing 1. The construction of each of such primary and secondary windings may be of any desired construction employing, for example, a split bobbin (not shown) having several winding grooves in its peripheral surface or a bobbin (not shown) without having such grooves on the peripheral surface thereof for solenoid winding. Alternatively, the construction may be so modified as to also accommodate one or more high voltage diodes (not shown) in the casing 1 for connection thereof with the secondary winding so as to directly obtain DC high voltage therefrom. In the above case, it is possible to connect the high voltage diode only to the end of winding of the secondary winding, or to connect a plurality of high voltage diodes alternately to the secondary winding divided into a plurality of sections.

Referring also to FIGS. 3 to 8, the arrangement for mounting the high voltage variable resistor 7 to the first casing 1 will be more specifically described hereinbelow.

Figure 3:
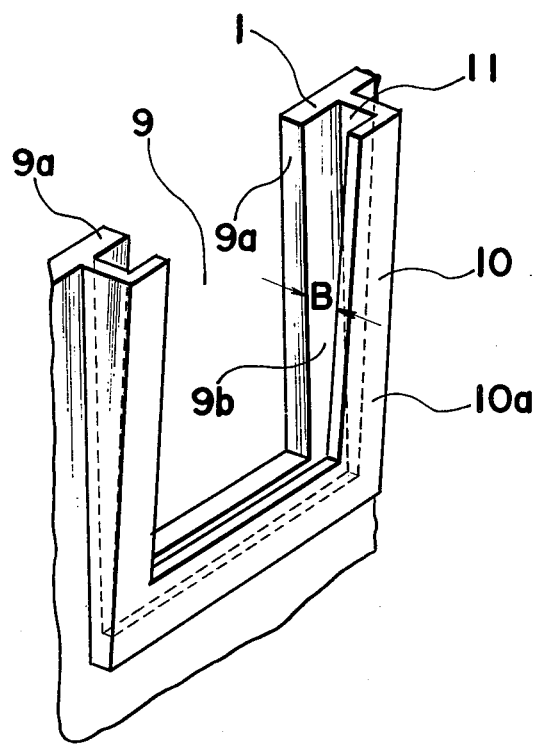
FIG. 3 is a fragmentary perspective view showing, on an enlarged scale, a frame structure provided around a cut-out portion of a casing of the fly back transformer shown in FIGS. 1 and 2.
Figure 4:
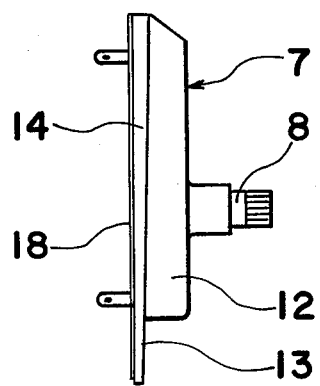
FIG. 4 is a longitudinal side elevational view of a high voltage variable resistor to be employed in the fly back transformer of FIGS. 1 and 2.
Figure 5:
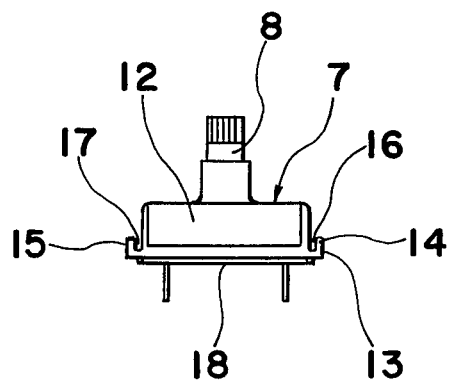
FIG. 5 is a widthwise side elevational view of the high voltage variable resistor of FIG. 4.
Figure 6:
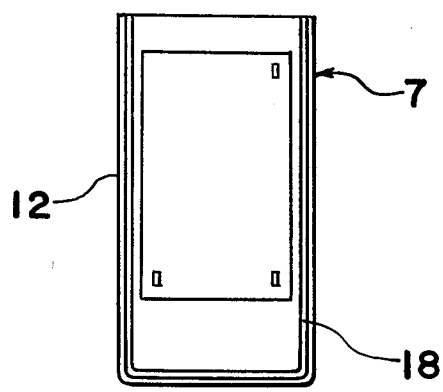
FIG. 6 is a bottom plan view of the high voltage variable resistor of FIG. 4.

As shown in FIG. 3, around the peripheral edges 9a of the cut-out portion 9 formed in one side wall of the casing 1, there is provided a frame wall 10 rigidly connected to or integrally formed with the side face 9b of the peripheral edges 9a of said cut-out portion 9, and having a generally L-shaped cross section so as to provide a fitting groove 11 all along said cut-out portion 9 between the upper surface 10a of the frame wall 10 and the corresponding side face 9b of the peripheral edges 9a. The upper surface 10a of the frame wall 10 is so inclined with respect to the peripheral edges 9a that the fitting groove 11 is sloped or tapered to be narrowed from the upper opening towards the bottom wall of the casing 1, i.e. at the vertical side portions of the groove 11 except for the portion thereof adjacent to the bottom of said casing 1.

It is to be noted here that the frame wall 10 described as employed in the foregoing embodiment for providing the fitting groove 1 may be dispensed with, in the case where the thickness of the casing 1 is large, with a fitting groove being directly formed in the peripheral edges 9a of the cut-out portion 9.

In FIGS. 4 to 7, the high voltage variable resistor 7 has a second casing 12 also of an electrically insulating material in which an insulative substrate of a predetermined configuration applied with a thin film resistor thereon, a sliding contact or slider, and a flange portion (each of which is not shown for brevity) for fixing the slider mounted at the end of the control knob shaft 8, etc. are accommodated so as to constitute said high voltage variable resistor 7. The second casing 12 as described above is to be fitted into the groove 11 of the first casing 1 in a manner to be described in detail hereinbelow.

Figure 7:
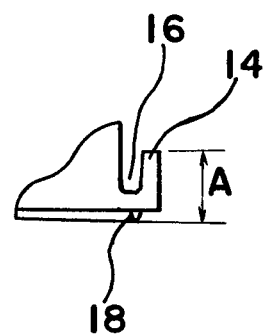
FIG. 7 is a fragmentary side elevational view, showing on an enlarged scale, the construction of a peripheral wall and a peripheral protrusion provided on the high voltage variable resistor of FIG. 4.

Along the peripheral edges 13 in the longitudinal direction of the second casing 12, there are provided a pair of projecting walls 14 and 15, each of which is tapered or sloped at the same inclination as that of the fitting groove 11 of the casing 1 so that the peripheral edges 13 including said projecting walls 14 and 15 are fitted into said fitting groove 11. As is most clearly seen in FIG. 5, there are respectively formed linear recesses 16 and 17 in the casing 12 along the inner sides of the projecting walls 14 and 15. These recesses 16 and 17 are intended to forcibly correct any slight curving or warping which may be present in the peripheral edge portions 13 of the second casing 12, when said peripheral edge portions 13 are fitted into the fitting groove 11 of the first casing 1. More specifically, since the portions of the casing 12 at the linear recesses 16 and 17 are thin in the thickness therreof so as to be easily twisted, the peripheral edges 13 of the casing 12 may be readily fitted into the fitting groove 11, even if slightly poor in the linearity thereof in the longitudinal direction. It is to be noted, however, that, to the present invention, the recesses 16 and 17 are not essential, but may be dispensed with depending on necessity. The second casing 12 further has a wire-like protrusion 18 formed on the reverse surface of the casing 12 (FIGS. 6 and 7) so as to extend along the peripheral edges 13 of the casing 12 except for the upper portion thereof in such a position as to contact the corresponding side face 9b of the peripheral edges 9a of the cut-out portion 9, when the peripheral edges 13 of the second casing 12 are fitted into the groove 11 of the first casing 1. As shown in FIG. 7, the wire-like protrusion 18 should preferably have a cross section narrowed towards the front edge portion thereof.

It shold be noted here that in the foregoing embodiment, although the wire-like protrusion 18 is described as provided on the reverse surface of the second casing 12, such wire-like protrusion is not limited in its installation to the reverse surface alone, but may be provided on the upper surface of the casing 12, and that of the protrusion 18 described as one in number may be replaced by a plurality of protrusions provided in parallel relation to each other.

It should also be noted that, although the projecting walls 14 and 15 of the casing 12 are described as provided with the inclination corresponding to that of the fitting groove 11 of the casing 1, such inclination may be provided on the wire-like projection 18 instead of the projection walls 14 and 15. In short, it has only to be arranged that the width equal to the height of the projecting wall 14 or 15 and that of the wire-like projection 18, i.e. the thickness A of the peripheral edges 13 of the casing 12, becomes somewhat larger than a width B of the fitting groove 11 of the casing 1 as shown in FIG. 3 at each corresponding position.

By the above arrangement, for mounting the high voltage variable resistor 7 onto the casing 1, the thinner portion or lower portion of the tapered peripheral edges 13 of the second casing 12 is fitted or inserted into the fitting groove 18 of the casing 1 from the wide upper open portion of said groove 11. In the above case, the second casing 12 may readily be inserted up to a predetermined position of the fitting groove 11, since there is a sufficient room between the width B of the groove 11 and the thickness A of the peripheral edges 13. Upon reaching the predetermined position, the width B of the fitting groove 11 and the thickness A of the peripheral edges 13 become generally equal to each other, so that the second casing 12 can not be further inserted into the fitting groove 11 unless a depressing force is applied to said casing 12. In the above case, such a depressing force is applied to the casing 12 in the direction of insertion thereof, and the second casing 12 is brought into a state where the wire-like protrusion 18 thereof is crushed on the whole or the fitting groove 11 is pushed open in the widthwise direction thereof, and thus, the second casing 12 is forcibly pressed into the predetermined position. More specifically, in the case where a comparatively soft resin such as Noryl resin (name used in trade for polyphenylene oxide manufactured by General Electric Co.) is employed, for the second casing 12, while a comparatively hard resin such as polybutylene terephthalate resin, etc. is used for the first casing 1, the wire-like protrusion 18 is crushed, while on the contrary, if a comparatively hard resin such as polybutylene terephthalate or the like is employed for the second casing 12 and a comparatively soft resin such as Noryl resin (mentioned above) is adopted for the first casing 1, the fitting groove 11 is pressed open, and if the materials for the casings 1 and 2 have approximately the same hardness, both of the states as described above are simultaneously present. Accordingly, in any of the above cases, the whole portion of the peripheral edges 13 of the casing 12 is mounted into the fitting groove 11 under pressure.

Figure 8:
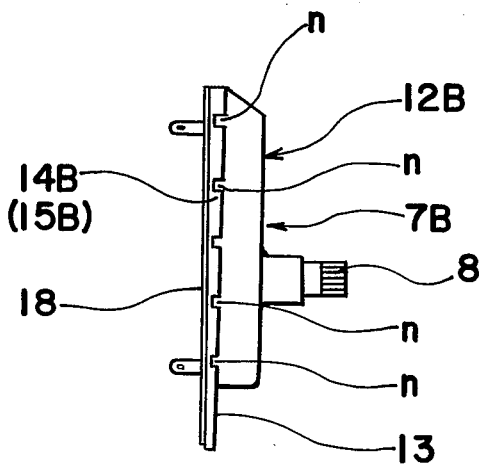
FIG. 8 is a view similar to FIG. 4, which particularly shows a modification thereof.

Referring to FIG. 8, there is shown a modification of the second casing 12 for the high voltage variable resistor 7 in FIGS. 1 to 7. In the modified high voltage variable resistor 7B of FIG. 8, the projecting walls 14B and 15B provided at the peripheral edges 13 of the casing 12B are each further formed with a plurality of notches or recesses n having a suitable width and provided at predetermined intervals as shown. By the above arrangement, even when the linearity of the peripheral edges 13 is slightly poor in the longitudinal direction thereof, the strain resulting therefrom is easily corrected for the mounting of the casing 12B into the groove 11 of the casing 1 under an extremely favorable state.

As is clear from the foregoing description, according to the arrangement of the present invention, the leakage of the insulating material can be prevented without employment of sealing members as in the conventional arrangements, with consequent reduction in cost, while on the other hand, since only a slight depressing force applied to the second casing 12 is sufficient for the mounting of the high voltage variable resistor onto the first casing, the assembly work thereof is simplified.

Moreover, in the case where it is required to pour the insulating material also into the second casing 12, such pouring of the insulating material may be simultaneously effected when the insulating material is poured into the first casing 1, if the bottom portion of the second casing 12 is opened, with a further facilitation of the entire manufacturing process.

Figure 9:
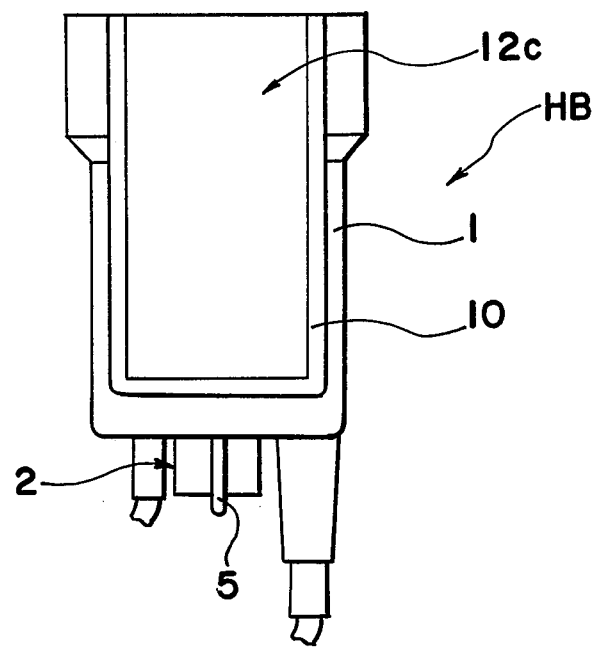
FIG. 9 is a schematic front elevational view of a high voltage generating device according to a modification of the present invention.
Figure 10:
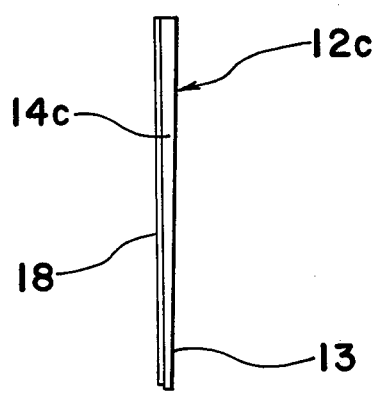
FIG. 10 is a longitudinal side elevational view of a shielding plate employed in the arrangement of FIG. 9.
Figure 11:
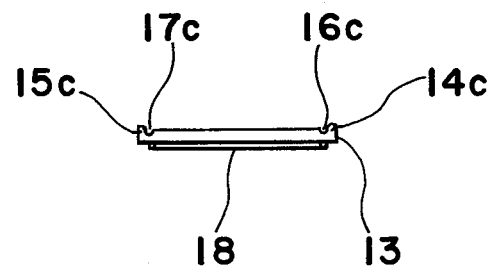
FIG. 11 is a widthwise side elevational view of the shielding plate of FIG. 10.
Figure 12:
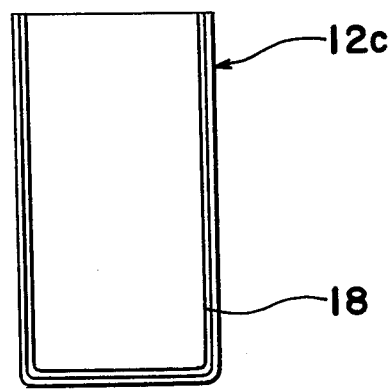
FIG. 12 is a bottom plan view of the shielding plate of FIG. 10.
Figure 13:
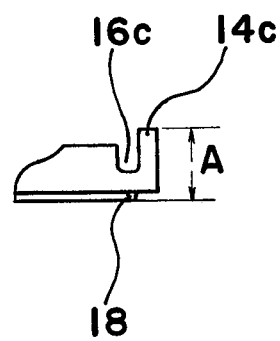
FIG. 13 is a fragmentary side elevational view showing, on an enlarged scale, the construction of the peripheral wall and the peripheral protrusion provided on the shielding plate of FIG. 10.
Figure 14:
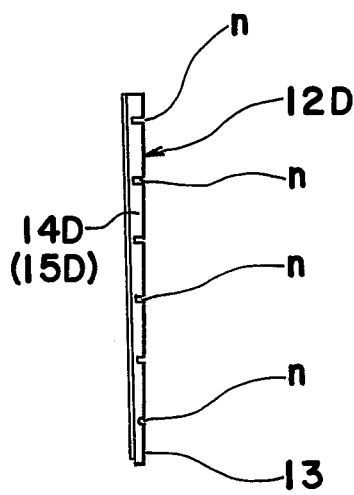
FIG. 14 is a view similar to FIG. 4, which particularly shows a further modification thereof.
Figure 15:
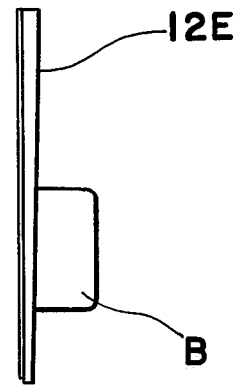
FIG. 15 is a view similar to FIG. 10, which particularly shows a still further modification thereof.

Referring further to FIGS. 9 to 15, there is shown in FIG. 9 a modification of the high voltage generating device of FIGS. 1 to 8. In the modified high voltage generating device HB of FIG. 9, the second casing 12 described as accommodating therein the high voltage variable resistor 7 in the arrangement of FIGS. 1 to 7 is replaced by merely a shielding plate 12C which has a configuration generally similar to the casing 12 except that the components for the variable resistor 7 and the portion for accommodating said components are dispensed with. As is seen from FIGS. 10 to 14, the shielding plate 12C also has the pair of projecting side walls 14C and 15C provided in the longitudinal direction along the peripheral edges 13 thereof, and each of the side walls 14C and 15C is tapered or sloped at the same inclination as that of the fitting groove 11 of the casing 1, with the linear recesses 16C and 17C being formed in the plate 12C along the inner side of the projecting side walls 14C and 15C. Additionally, the projecting walls 14C and 15C may further be modified to be formed with a plurality of notches or recesses n as in the projecting walls 14D and 15D of the another modification 12D shown in FIG. 14, in which case, favorable effects similar to those in the casing 12B described with reference to FIG. 8 may be obtained. Furthermore, the shielding plate 12C of FIGS. 10 to 13 in the flat plate-like shape may further be provided with a box or container portion B formed at one portion on its one surface as shown in a still another modification 12E of FIG. 15. In this case, it becomes possible to accommodate electronic parts such as capacitors, etc. in the container portion B.

It should be noted here that in the foregoing embodiment, although the present invention is mainly described with reference to a high voltage generating device in the form of the fly back transformer, the concept of the present invention is not limited to such a fly back transformer alone, but may readily be applied to various kinds of similar devices, for example, a high voltage supplying device in which high voltage electronic parts such as capacitors, diodes and the like for constituting a voltage multiplying or doubler rectifier circuit or the like or capacitors for correcting cathode ray tube capacitance, etc. are accommodated in the casing 1.

Although the present invention has been fully described by way of example with reference to the attached drawings, it is to be noted that various changes and modifications will be apparent to those skilled in the art. Therefore, unless otherwise such changes and modifications depart from the scope of the present invention, they should be construed as included therein.

What is claimed is:

1. A high voltage generating device which comprises a first casing open at one side face thereof and accommodating therein high voltage electrical components, a second casing which is mounted in a cut-out portion formed in a side wall of said first casing and open at one edge thereof, and an electrically insulating material filled in a space within said first casing, said first casing being provided, along its entire peripheral wall adjacent to said cut-out portion thereof, with a fitting groove extending from said one open side face towards the bottom portion of said first casing and tapered so as to be narrowed at the side of said bottom portion, said second casing being formed with a wire-like protrusion provided adjacent to the peripheral edges thereof on its one surface in a position corresponding to one side face of said cut-out portion defining said fitting groove of said first casing, said peripheral edges of said second casing which include said wire-like protrusion being arranged, in thickness thereof, to be larger to a certain extent, than widths of said fitting groove at portions thereof corresponding to respective portions of said fitting groove.

2. A high voltage generating device as claimed in claim 1, wherein said high voltage electrical components are a primary winding and a secondary winding wound on a core accommodated in said first casing so as to form the high voltage generating device into a fly back transformer.

3. A high voltage generating device as claimed in claim 1, wherein said high voltage electrical components are capacitors, diodes and the like accommodated in said first casing for constituting a voltage multiplying rectifier circuit so as to form the high voltage generating device into a high voltage supplying device.

4. A high voltage generating device as claimed in claim 1, wherein said second casing is provided with projecting side walls at said peripheral edges thereof in positions corresponding to said fitting groove of said first casing, said projecting side walls being each tapered at the same inclination as that of said fitting groove.

5. A high voltage generating device as claimed in claim 4, wherrein said second casing is further provided with linear recesses respectively formed therein adjacent to inner side faces of said projecting side walls.

6. A high voltage generating device as claimed in claim 5, wherein said projecting side walls of said second casing are each provided with a plurality of notches having a predetermined width and formed therein at predetermined intervals.

7. A high voltage generating device as claimed in claim 1, wherein said second casing includes a variable resistance element so as to constitute a high voltage variable resistor for deriving high voltage from the high voltage generating device.

8. A high voltage generating device as claimed in claim 1, wherein said second casing is a shielding plate for sealing said cut-out portion of said first casing.

9. A high voltage generating device as claimed in claim 8, wherein said shielding plate is provided, at a portion on one surface thereof, with a container portion for accommodating therein electronic parts.

* * * * *